United States Patent
Kang et al.

(10) Patent No.: US 12,347,795 B2
(45) Date of Patent: Jul. 1, 2025

(54) SEMICONDUCTOR PACKAGE INCLUDING UNEVEN STRUCTURES AND ELECTRONIC DEVICE INCLUDING THE SAME

(71) Applicant: SAMSUNG ELECTRONICS CO., LTD., Suwon-si (KR)

(72) Inventors: Bonggyu Kang, Yongin-si (KR); Yongha Kim, Seongnam-si (KR); Youngsoo Jang, Suwon-si (KR); Heesu Kim, Suwon-si (KR); Kwangsoo Park, Suwon-si (KR); Junsik Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 553 days.

(21) Appl. No.: 17/659,778

(22) Filed: Apr. 19, 2022

(65) Prior Publication Data

US 2023/0048277 A1 Feb. 16, 2023

(30) Foreign Application Priority Data

Aug. 10, 2021 (KR) .................. 10-2021-0105596

(51) Int. Cl.
*H01L 23/60* (2006.01)
*H01L 23/367* (2006.01)
(Continued)

(52) U.S. Cl.
CPC .......... *H01L 23/60* (2013.01); *H01L 23/3675* (2013.01); *H01L 24/16* (2013.01);
(Continued)

(58) Field of Classification Search
CPC ..... H01L 24/16; H01L 24/32; H01L 25/0652; H01L 2224/73204
(Continued)

(56) References Cited

U.S. PATENT DOCUMENTS

2002/0102833 A1* 8/2002 Ho .................. H01L 23/4334
257/E23.092
2012/0171814 A1 7/2012 Choi et al.
(Continued)

FOREIGN PATENT DOCUMENTS

JP 2005-353956 12/2005
JP 2021108350 A * 7/2021
(Continued)

*Primary Examiner* — Phuc T Dang
(74) *Attorney, Agent, or Firm* — MORGAN, LEWIS & BOCKIUS LLP

(57) ABSTRACT

A semiconductor package includes a package board, at least one semiconductor chip disposed on the package board, a molding member disposed on the package board and at least partially surrounding the at least one semiconductor chip, and a heat dissipation member disposed on the at least one semiconductor chip and the molding member. The molding member has first region in which a plurality of uneven structures are disposed, and a second region spaced apart from an external region by the plurality of uneven structures. The plurality of uneven structures protrude to a predetermined height away from the semiconductor chip, the molding member, and the heat dissipation member, and may be formed as a part of the head dissipation member, or formed separately.

21 Claims, 17 Drawing Sheets

(51) Int. Cl.
　　　*H01L 23/00*　　　　(2006.01)
　　　*H01L 25/065*　　　(2023.01)

(52) U.S. Cl.
　　　CPC .............. *H01L 24/32* (2013.01); *H01L 24/73* (2013.01); *H01L 25/0652* (2013.01); *H01L 2224/16225* (2013.01); *H01L 2224/32225* (2013.01); *H01L 2224/73204* (2013.01); *H01L 2924/1438* (2013.01); *H01L 2924/30105* (2013.01); *H01L 2924/30201* (2013.01); *H01L 2924/30205* (2013.01)

(58) Field of Classification Search
　　　USPC ........................................................ 257/678
　　　See application file for complete search history.

(56) References Cited

U.S. PATENT DOCUMENTS

| | | | |
|---|---|---|---|
| 2015/0014840 A1* | 1/2015 | Watanabe | H01L 23/3128 257/796 |
| 2015/0108628 A1* | 4/2015 | Yu | H01L 23/3675 257/712 |
| 2020/0091030 A1 | 3/2020 | Kwon | |
| 2020/0294869 A1* | 9/2020 | Jeong | H01L 22/32 |
| 2020/0373216 A1* | 11/2020 | Yoo | H01L 24/05 |
| 2021/0020537 A1* | 1/2021 | Chan Arguedas | H01L 24/29 |
| 2021/0345519 A1* | 11/2021 | Tian | H05K 7/20809 |
| 2022/0009103 A1 | 1/2022 | Buerkle | |

FOREIGN PATENT DOCUMENTS

| | | |
|---|---|---|
| KR | 10-1715761 | 3/2017 |
| KR | 10-1809004 | 12/2017 |
| KR | 10-2019-0065749 | 6/2019 |
| KR | 10-2131268 | 7/2020 |

\* cited by examiner

SEMICONDUCTOR PACKAGE INCLUDING UNEVEN STRUCTURES AND ELECTRONIC DEVICE INCLUDING THE SAME

CROSS TO REFERENCE TO RELATED APPLICATION

This application claims priority under 35 U.S.C. § 119 to Korean Patent Application No. 10-2021-0105596 filed on Aug. 10, 2021 in the Korean Intellectual Property Office, the disclosure of which is incorporated by reference herein in its entirety.

TECHNICAL FIELD

The present disclosure relates to a semiconductor package, and more particularly, to an electronic device including the same.

DISCUSSION OF THE RELATED ART

Semiconductor devices are used in electronic devices as general purpose processors, for memory storage, as display drivers, and the like. Semiconductor devices may include semiconductor packages that provide functionality to the semiconductor device, such as data storage and general processing.

The semiconductor package refers to a semiconductor integrated circuit (IC), which may be a packaged circuit that is manufactured by forming components such resistors, transistors, capacitors, and the like, in a silicon wafer, and connecting the components to each other using a metal lead. In order to maintain the functionality and reduce size according to consumer demand, a plurality of semiconductor chips having various functions may be embedded in a single package.

However, when a semiconductor package that has accumulated electric charges is discharged in the manufacturing process, electrical stress may be generated in the semiconductor package, which may cause damage.

SUMMARY

An example embodiment of the present disclosure includes a semiconductor package which reduces the amount of electric charges accumulated in a semiconductor package by forming uneven structures on a surface of the semiconductor package, and may reduce additional development cost and a delay in development period of the semiconductor package, and may reduce damages occurring in a manufacturing process.

According to an example embodiment of the present disclosure, a semiconductor package includes a package board; at least one semiconductor chip disposed on the package board; a molding member disposed on the package board and at least partially surrounding the at least one semiconductor chip; and a heat dissipation member disposed on the at least one semiconductor chip and the molding member, and including an outward surface including a first region in which a plurality of uneven structures is disposed, and a second region. Each of the plurality of uneven structures protrudes to a predetermined height in an outward direction away from the at least one semiconductor chip and the molding member, and is spaced apart from a proximate structure of the plurality of uneven structures in a first direction and a second direction. The first direction and the second direction are each parallel to the upper surface of the package board.

According to an example embodiment of the present disclosure, a semiconductor package includes a package board, at least one semiconductor chip disposed on the package board, and a molding member disposed on the package board and at least partially surrounding the at least one semiconductor chip, and including a first region in which a plurality of uneven structures are disposed, and a second region spaced apart from an external region by the plurality of uneven structures, wherein each of the plurality of uneven structures protrudes to a predetermined height in an outward direction away from the semiconductor chip, is are spaced apart from a proximate structure of the plurality of uneven structures in a first direction and a second direction, and wherein the first direction and the second direction are each parallel to an upper surface of the package board.

According to an example embodiment of the present disclosure, a semiconductor package includes a package board, at least one semiconductor chip disposed on the package board in a direction perpendicular to an upper surface of the package board, a molding member disposed on the package board and at least partially surrounding the at least one semiconductor chip; and a heat dissipation member disposed on the at least one semiconductor chip and the molding member, wherein a plurality of uneven structures separating the heat dissipation member from metal objects external to the heat dissipation member is disposed on an upper surface of the heat dissipation member, and wherein a magnitude of capacitance formed between the heat dissipation member and the metal objects is influenced by the plurality of uneven structures.

According to an example embodiment of the present disclosure, an electronic device includes a main board, a memory package mounted on the main board, the memory package including a package board, a plurality of semiconductor chips disposed on the package board, and a molding member disposed on the package board and at least partially surrounding the plurality of semiconductor chips; a controller package mounted on the main board and configured to output a control signal for controlling the memory package; an auxiliary memory package configured as a memory buffer between the memory package and the controller package; and a plurality of uneven structures disposed on an upper surface of the memory package, wherein each of the plurality of uneven structures is spaced apart from a proximate structure of the plurality of uneven structures in a first direction and a second direction, wherein the first direction and the second direction are each parallel to an upper surface of the package board, and wherein each of the plurality of uneven structures protrudes to a predetermined height in a third direction perpendicular to the upper surface of the package board.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described in detail with reference to the accompanying drawings.

Figure 1:
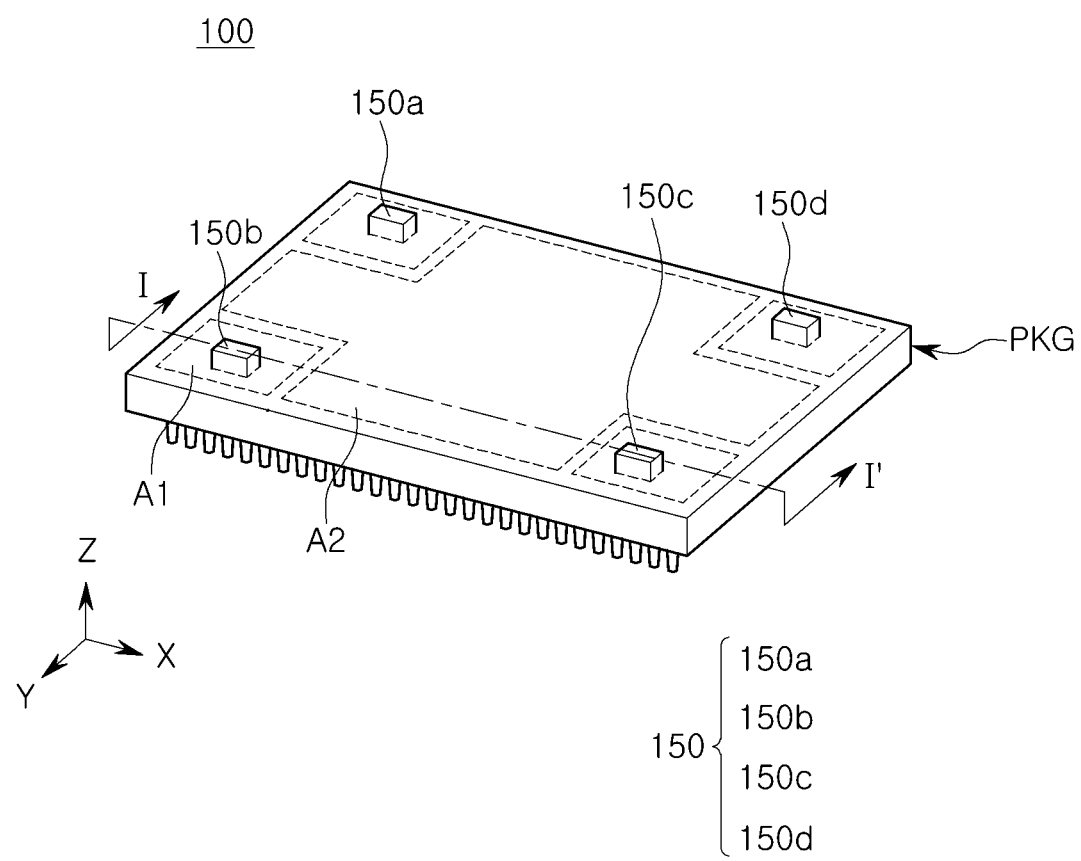
FIG. 1 is a diagram that illustrates a semiconductor package according to an example embodiment of the present disclosure.

FIG. 1 is a diagram that illustrates a semiconductor package according to an example embodiment.

Referring to FIG. 1, a semiconductor package PKG in an example embodiment may include a plurality of uneven structures 150 (150a, 150b, 150c, and 150d) which protrude from a surface of the semiconductor package PKG.

The surface of the semiconductor package PKG may be divided into a first region A1 in which the plurality of uneven structures 150 are disposed, and a second region A2. For example, the surface of the semiconductor package PKG (e.g., an upper surface) may include a heat dissipation member, the second region A2 may be disposed in a central portion of the heat dissipation member, and the first region A1 may be disposed in an outer portion of the heat dissipation member. However, embodiments are not necessarily limited thereto, and the surface of the semiconductor package PKG may include a molding member. In this case, the second region A2 may be disposed in a central portion of the molding member, and the first region A1 may be disposed in an outer portion of the molding member.

In an example embodiment, the first region A1 in which the plurality of uneven structures 150 are disposed may be disposed at a vertex of the surface of the semiconductor package PKG. For example, each of the plurality of uneven structures 150 may be disposed adjacent to corners of the surface of the semiconductor package PKG. However, embodiments are not necessarily limited thereto. For example, the first region A1 in which the plurality of uneven structures 150 are disposed may be disposed adjacent to the vertex of the surface of the semiconductor package PKG, and/or in other positions as long as the structural balance of the semiconductor package PKG is able to be maintained.

In the semiconductor package PKG in an example embodiment, the plurality of uneven structures 150 may include four uneven structures 150a, 150b, 150c, and 150d. As an example, as for the plurality of uneven structures 150, two uneven structures 150 may be disposed in each of a first direction (e.g., X direction) and a second direction (e.g., Y direction), with both directions parallel to the upper surface of the semiconductor package PKG.

However, embodiments are not necessarily limited thereto. For example, the plurality of uneven structures 150 may include four or fewer uneven structures, and may include four or more uneven structures if desired. In this case, the arrangement of the plurality of uneven structures 150 may also vary in example embodiments. In an embodiment, each of the plurality of uneven structures 150 illustrated in FIG. 1 may have a rectangular parallelepiped shape, but embodiments are not necessarily limited thereto, and the plurality of uneven structures 150 may have various shapes.

The plurality of uneven structures 150 may be formed together when an upper surface structure of the semiconductor package PKG is manufactured during a process of manufacturing the semiconductor package PKG. However, embodiments are not necessarily limited thereto, and the plurality of uneven structures 150 may be separately formed and may be attached to the upper surface of the semiconductor package PKG.

In an example embodiment, the plurality of uneven structures 150 of the semiconductor package PKG may influence a magnitude of capacitance formed between metals disposed on the surface of the semiconductor package PKG and on an external region of the semiconductor package PKG.

To reduce the capacitance, the semiconductor package PKG may be manufactured such that an area of the first region A1 in which the plurality of uneven structures 150 are disposed is reduced. For example, an area of the first region A1 may be smaller than an area of the second region A2 in a direction parallel to the surface of the semiconductor package PKG. The relationship between the area of the first region A1 and the capacitance will be described in greater detail later.

Figure 2:
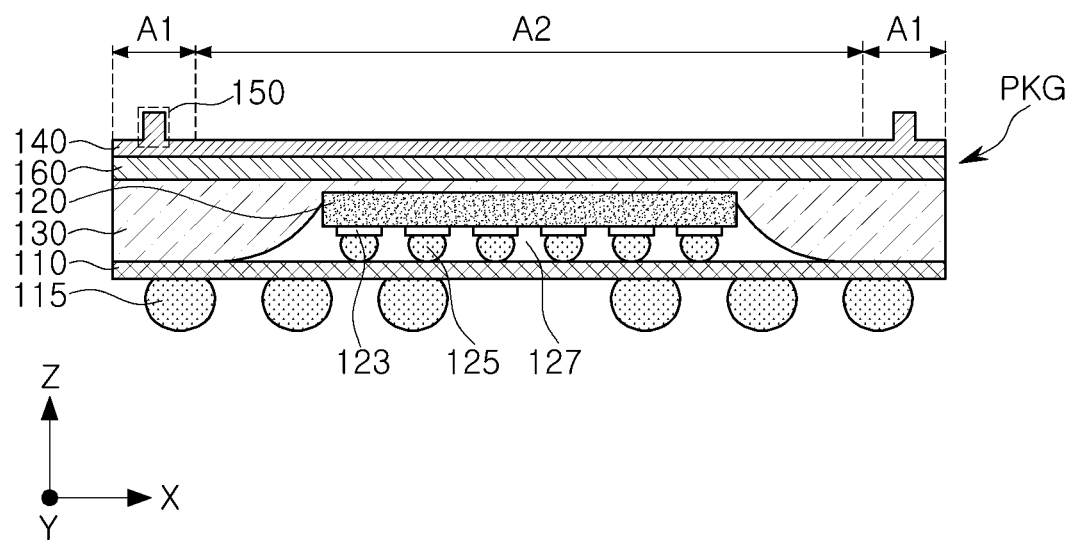
FIG. 2 is a cross-sectional diagram that illustrates a semiconductor package according to an example embodiment of the present disclosure.

FIG. 2 is a cross-sectional diagram that illustrates a semiconductor package according to an example embodiment.

FIG. 2 is a cross-sectional diagram that illustrates the semiconductor package PKG in FIG. 1 taken along line I-I'. Referring to FIG. 2, the semiconductor package PKG in an example embodiment may include a package board 110, at least one semiconductor chip 120, a molding member 130, and a heat dissipation member 140. The semiconductor package PKG may further include bonding member 160 disposed between the molding member 130 and the heat dissipation member 140.

The configuration and structure of the semiconductor package PKG in an example embodiment is not necessarily limited to any particular example. For example, the semiconductor package PKG in an example embodiment may be applied to general semiconductor packages with no limitation in the shape of the surfaces thereof.

The semiconductor package PKG of the present disclosure may be applied to various electronic devices. For example, the semiconductor package PKG may be applied to a controller, a DRAM memory device, a NAND memory device, and the like.

The package board 110 may be implemented as a semiconductor package board, such as a printed circuit board (PCB), a ceramic board, or a tape wiring board. For example, the package board 110 may include a thermosetting resin such as an epoxy resin, a thermoplastic resin such as polyimide, or a photosensitive insulating layer. In an embodiment, the package board 110 may include a material such as prepreg, Ajinomoto build-up film (ABF), FR-4, bismaleimide triazine (BT), and photo imaginable dielectric resin (PID).

In an embodiment, the package board 110 may include a plurality of pads disposed on upper and lower surfaces opposing each other, respectively, and wirings electrically connecting the plurality of pads to each other. The package board 110 may further include connection terminals 115 connected to the pads disposed on the lower surface of the package board 110 in a lower portion thereof.

The connection terminals 115 may be electrically connected to an external device such as a main board. For example, the connection terminals 115 may include a flip-chip connection structure having a solder ball, a conductive bump, or a grid array such as a pin grid array, a ball grid array, or a land grid array.

At least one semiconductor chip 120 may be disposed on the upper surface of the package board 110 and may be electrically connected to a pad disposed on the upper surface of the package board 110. For example, the at least one semiconductor chip 120 may be mounted on the package board 110 by a flip-chip bonding method through connection members 125 disposed on the connection electrodes 123 disposed on the lower surface of the at least one semiconductor chip 120, which may be an active surface. In some embodiments, multiple semiconductor chips 120 may be disposed on the upper surface of the package board 110 in, for example, a 2.5D or 3D structure.

The connection members 125 may include a solder ball or a copper pillar. An underfill resin 127 including an epoxy resin may be formed between the active surface of the at least one semiconductor chip 120 and the upper surface of the package board 110, and may surround the connection members 125.

However, the semiconductor package PKG is not necessarily limited to the illustrated example. For example, the semiconductor package PKG may include at least one semiconductor chip 120 mounted on the package board 110 by a wire bonding method.

In an embodiment, the semiconductor package PKG may be configured as a system-in-package (SIP) in which various types of semiconductor chips are embedded. Accordingly, the at least one semiconductor chip 120 may include a logic chip, a memory chip, and the like.

For example, the at least one semiconductor chip 120 may include a logic chip such as a central processing unit (CPU), a graphics processing unit (GPU), a field programmable gate array (FPGA), a digital signal processing unit (DSP), a cryptographic processor, a microprocessor, a microcontroller, an analog-to-digital converter, and an application-specific integrated circuit (ASIC). The at least one semiconductor chip 120 may include a memory chip such as a dynamic random-access memory (DRAM), a static random-access memory (SRAM), a flash, a phase-change random-access memory (PRAM), and a resistance random access memory (ReRAM), a ferroelectric random-access memory (FeRAM), a magnetic random-access memory (MRAM), a high bandwidth memory (HBM), a hybrid memory cubic (HMC), and the like.

Referring to FIG. 2, embodiments of the semiconductor chip 120 may include only one semiconductor chip 120 in the semiconductor package PKG may be one, but embodiments are not necessarily limited thereto. For example, a plurality of semiconductor chips 120 may be spaced apart from each other in the first direction and the second direction, parallel to the upper surface of the package board 110.

In an example embodiment of the semiconductor package PKG, at least one semiconductor chip 120 may be stacked in a third direction (e.g., a Z direction) perpendicular to the upper surface of the package board 110. For example, a first semiconductor chip disposed in lowermost portion of the at least one semiconductor chip 120 may be disposed on the upper surface of the package board 110, and a second semiconductor chip disposed on the first semiconductor chip among the at least one semiconductor chip 120 may be disposed to overlap the first semiconductor chip in the third direction or may be disposed to overlap a portion of an upper surface of the first semiconductor chip.

In this case, the first semiconductor chip and the second semiconductor chip may be electrically connected to the package board 110 through a bonding wire. However, embodiments are not necessarily limited thereto, and the second semiconductor chip disposed on the first semiconductor chip may be electrically connected to the first semiconductor chip through a wiring layer or a connection pad formed on the upper surface of the first semiconductor chip.

The type of the semiconductor chip 120, the number of the semiconductor chips included in the semiconductor chip 120, and the arrangement of semiconductor chip 120 described above may be examples, and the configuration of the semiconductor package PKG in an example embodiment is not necessarily limited to the aforementioned example. For example, the semiconductor package PKG may further include an interposer substrate connected between the package board 110 and the at least one semiconductor chip 120.

The molding member 130 may be disposed on the package board 110, and may at least partially surround the semiconductor chip 120. The molding member 130 may include an insulating material, and for example, an epoxy molding compound (EMC) may be used. The molding member 130 may protect the semiconductor chip 120 and the other components from heat, moisture, impacts, and the like.

The heat dissipation member 140 may be disposed on the semiconductor chip 120 and the molding member 130 and may cover the other components included in the semiconductor package PKG. The heat dissipation member 140 may include a conductive material having high thermal conductivity. For example, the heat dissipation member 140 may include a metal or a metal alloy including gold (Au), silver (Ag), copper (Cu), iron (Fe), or the like, or a conductive material such as graphite or graphene. Accordingly, the heat dissipation member 140 may radiate heat generated from the semiconductor chip 120 to the outside.

In FIG. 2, the heat dissipation member 140 may be configured in the form of a heat dissipation plate, but embodiments are not necessarily limited thereto, and the heat dissipation member 140 may have a different shape from the example illustrated in the drawing. For example, a portion of the heat dissipation member 140 or the heat dissipation member 140 may be omitted, and the heat dissipation member 140 may be disposed in a form different from the example illustrated in FIG. 2 to increase heat dissipation performance.

The heat dissipation member 140 may be attached to the other components of the semiconductor package PKG by the bonding member 160. For example, the heat dissipation member 140 may close to the semiconductor chip 120 with the bonding member 160 therebetween. The bonding member 160 may be configured as a layer having a predetermined height in FIG. 2, but embodiments are not necessarily limited thereto. For example, the bonding member 160 may include a thermally conductive adhesive tape, thermally conductive grease, thermally conductive adhesive, and the like.

The heat dissipation member 140 included in the semiconductor package PKG in an example embodiment may include a first region A1 including a plurality of uneven structures 150, and a second region A2.

The plurality of uneven structures 150 may be formed on an upper surface of the heat dissipation member 140 by a press process, a molding process, or the like, when the heat dissipation member 140 is manufactured. However, embodiments are not necessarily limited thereto.

The plurality of uneven structures 150 may be spaced apart from each other in a first direction and a second direction which are each parallel to the upper surface of the package board 110. The plurality of uneven structures 150 may protrude to have a predetermined height with respect to the upper surface of the heat dissipation member 140. The plurality of even structures 150 may protrude in a third direction, for example, the Z direction of FIG. 2, away from the semiconductor chip 120 and the molding member 130. Accordingly, the second region A2 may be spaced apart from an external region by the plurality of uneven structures 150.

However, the structure of the semiconductor package PKG illustrated in FIG. 2 is merely an example and embodiments are not necessarily limited thereto. For example, the semiconductor package PKG may further include an insulating layer coated on the upper surface of the semiconductor chip 120, and a reinforcing member for preventing damages to the semiconductor package PKG.

Figure 3:
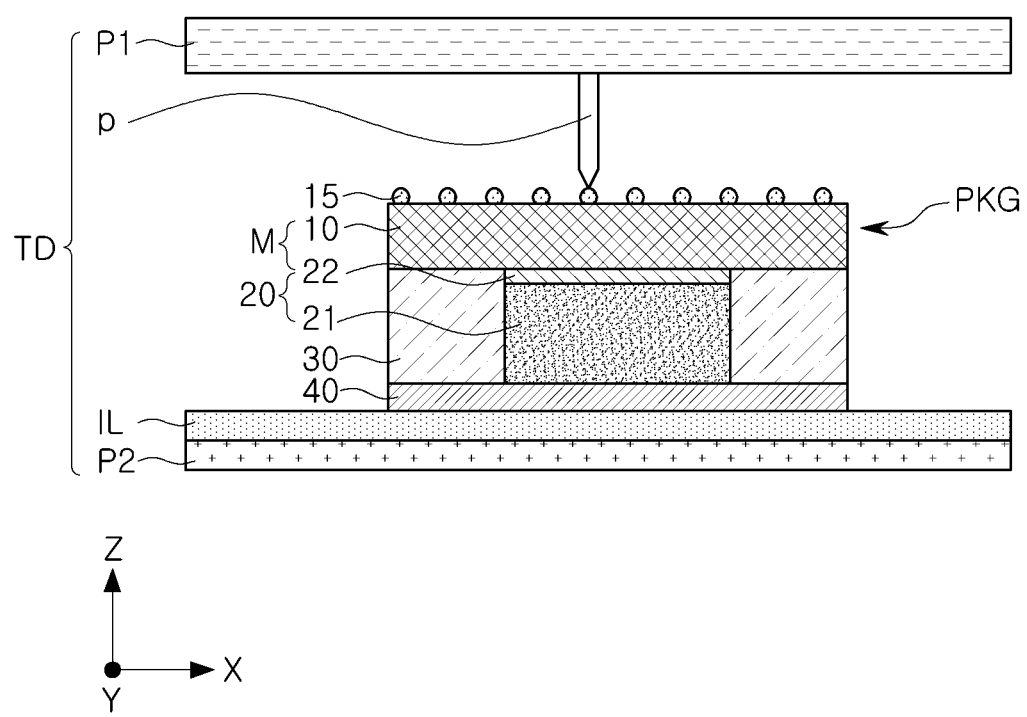
FIG. 3 is a diagram that illustrates an electrostatic test on a semiconductor package.
Figure 4:
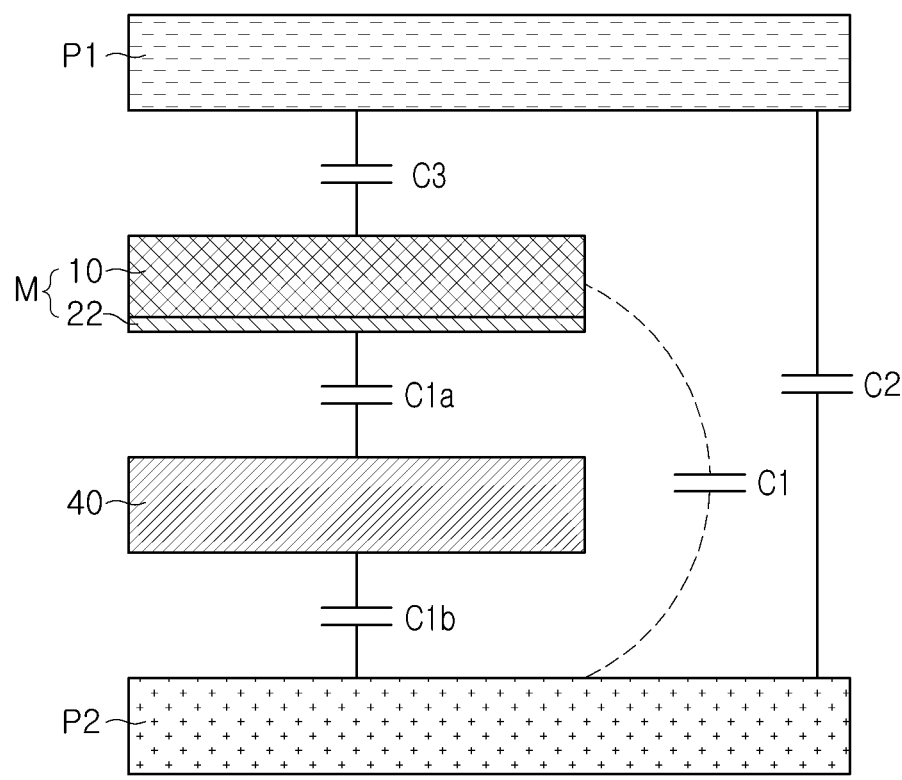
FIG. 4 is a diagram that illustrates capacitance formed between components when an electrostatic test is performed on a semiconductor package.
Figure 5:
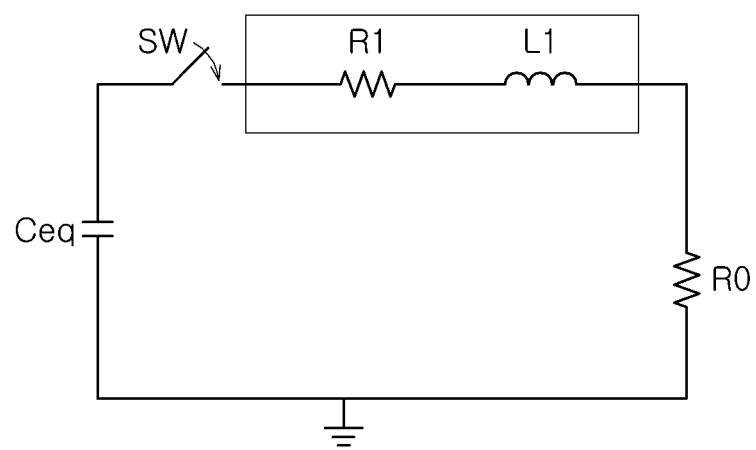
FIG. 5 is an equivalent circuit diagram that illustrates capacitance formed between components when an electrostatic test is performed on a semiconductor package.

FIG. 3 is a diagram that illustrates an electrostatic test on a semiconductor package. FIG. 4 is a diagram that illustrates capacitance formed between components when an electrostatic test is performed on a semiconductor package. FIG. 5 is an equivalent circuit diagram that illustrates capacitance formed between components when an electrostatic test is performed on a semiconductor package.

As the manufacturing process of the semiconductor package PKG is performed, a certain amount of electric charges may be accumulated in the semiconductor package PKG by electrostatic discharge (ESD). The accumulated electric charges may be discharged when the semiconductor package PKG approaches metals external to the semiconductor package PKG. In this case, electrical stress applied to the semiconductor package PKG may cause damage to the semiconductor package PKG. The charge device model (CDM) test may be a performance evaluation method that includes intentionally applying an electrical stress to the semiconductor package PKG similarly to the above-described process.

As the integrated circuit process is miniaturized, it is necessary to address the issue of damage to the semiconductor package PKG caused by static electricity. Conventionally, a method of preventing damage to the semiconductor package PKG caused by static electricity by installing a protection circuit in an integrated circuit has been used. However, the electrical stress applied to conventional semiconductor packages from the static electricity may vary depending on the type of the semiconductor package being manufactured.

Accordingly, conventional manufacturing methods of semiconductors may require an excessive amount of time and costs to configure the protection circuit across varying types and shapes of semiconductor packages. However, by forming the uneven structure on the upper surface of the semiconductor package PKG according to the present disclosure, no such custom protection circuit may be required, thereby reducing time, costs, and resources in the manufacturing process.

Referring to FIG. 3, a test device TD for performing the CDM test may include a ground plate P1, an electric field plate P2, an insulating layer IL, and a pogo pin p. However, embodiments are not necessarily limited thereto, and the configuration of the test device TD for performing the CDM test may vary.

A ground voltage may be applied to the ground plate P1 of the test device TD, and the pogo pin p may be connected to the ground plate P1. A voltage for accumulating electric charges in the semiconductor package PKG may be applied to the electric field plate P2 of the test device TD, and the insulating layer IL may be disposed on the upper surface of the electric field plate P2. For example, the insulating layer IL may include a material such as FR-4.

The semiconductor package PKG illustrated in FIG. 3 may include components corresponding to the semiconductor package PKG illustrated in FIG. 2. For example, the semiconductor package PKG may include a package board 10, a semiconductor chip 20, a molding member 30, and a heat dissipation member 40.

Connection terminals 15 may be disposed on the upper surface of the package board 10. The semiconductor chip 20 may include a board portion 21 and a wiring portion 22 including silicon. In the process of the CDM test, the wiring portion 22 and the package board 10 electrically connected to each other may be defined as a metal portion M.

However, semiconductor package PKG of FIG. 3 is different from the semiconductor package PKG of FIG. 2 in that the heat dissipation member 40 included in the semiconductor package PKG illustrated in FIG. 3 may not include the plurality of uneven structures 150. The amount of electric charges accumulated in the semiconductor packages PKG illustrated in FIGS. 2 and 3 may vary due to the presence or absence of the plurality of uneven structures 150.

In the process of the CDM test, electric charges may be accumulated in the semiconductor package PKG by the voltage applied to the electric field plate P2. The accumulated charge may be discharged to the ground plate P1 through the pogo pin p electrically connected to at least one of the connection terminals 15. The electrical stress applied to the semiconductor package PKG and a possibility of damage to the semiconductor package PKG may increase as the amount of electric charges accumulated and discharged in the semiconductor package PKG increases.

Referring to FIGS. 4 and 5, the amount of electric charges accumulated and discharged in the semiconductor package PKG may be determined by capacitance formed between the semiconductor package PKG and metals disposed outside of the semiconductor package PKG. For example, arc discharge may occur between the pogo pin p and the semiconductor package PKG during the CDM test. Referring to FIG.

5, the CDM test performed using arc discharge may be modeled as an RLC equivalent circuit.

As an example, the modeled RLC equivalent circuit may include a switch SW, a resistor R0 disposed between the pogo pin p and the ground plate P1, an equivalent inductance L1 defined by the pogo pin p and the semiconductor package PKG, an equivalent resistor RI defined by are discharge and the semiconductor package PKG, and an equivalent capacitance Ceq defined by the test device TD and the semiconductor package PKG.

Referring to FIG. 4, the equivalent capacitance Ceq which corresponds to the amount of electric charges accumulated and discharged in the semiconductor package PKG may be modeled by being determined by a combination of C1$a$, C1$b$, C2, and C3.

For example, the magnitude of the capacitance formed between the metal portion M and the heat dissipation member 40 may be C1$a$, and the magnitude of the capacitance formed between the heat dissipation member 40 and the electric field plate P2 may be C1$b$. Also, the magnitude of the capacitance formed between the ground plate P1 and the electric field plate P2 may be C2, and the magnitude of the capacitance formed between the ground plate P1 and the metal portion M may be C3.

In this case, C1, which corresponds to the magnitude of the capacitance formed between the semiconductor package PKG and the electric field plate P2, may correspond to the magnitude of the total capacitance C1 of when the capacitance formed between the metal portion M and the heat dissipation member 40 is connected to the capacitance formed between the heat dissipation member 40 and the electric field plate P2 in series. C1, which may be the magnitude of the capacitance formed between the semiconductor package PKG and the electric field plate P2 may be represented as in Equation 1.

$$C1 = \frac{C1a \times C1b}{C1a + C1b} \quad \text{[Equation 1]}$$

The magnitude of the modeled equivalent capacitance Ceq may be represented as in Equation 2.

$$Ceq = \frac{C1 \times C2}{C1 + C2} + C3 \quad \text{[Equation 2]}$$

As the magnitude of the equivalent capacitance Ceq decreases, the amount of electric charges accumulated and discharged in the semiconductor package PKG may decrease, and the intensity of current generated during the CDM test may decrease. Accordingly, by reducing the magnitude of the modeled equivalent capacitance Ceq, damages to the semiconductor package PKG caused by static electricity generated during the manufacturing process may be reduced.

The semiconductor package PKG in an example embodiment illustrated in FIG. 2 may decrease the magnitude of the equivalent capacitance Ceq by reducing C1$b$ among the capacitances C1$a$, C1$b$, C2, and C3 included in the modeled equivalent capacitance Ceq. When C1$b$ corresponding to the magnitude of the capacitance between the heat dissipation member 140 and the electric field plate P2 decreases, C1 corresponding to the magnitude of the capacitance formed between the semiconductor package PKG and the electric field plate P2 may also decrease. When C1 decreases, the magnitude of the equivalent capacitance Ceq related to the modeled semiconductor package PKG may decrease.

In other words, the semiconductor package PKG in an example embodiment, for example, according to FIG. 2, may increase the distance between the semiconductor package PKG and the metals in the external region of the semiconductor package PKG using the plurality of uneven structures, such that the amount of electric charges charged to and discharged from the semiconductor package PKG may decrease.

Figure 6:
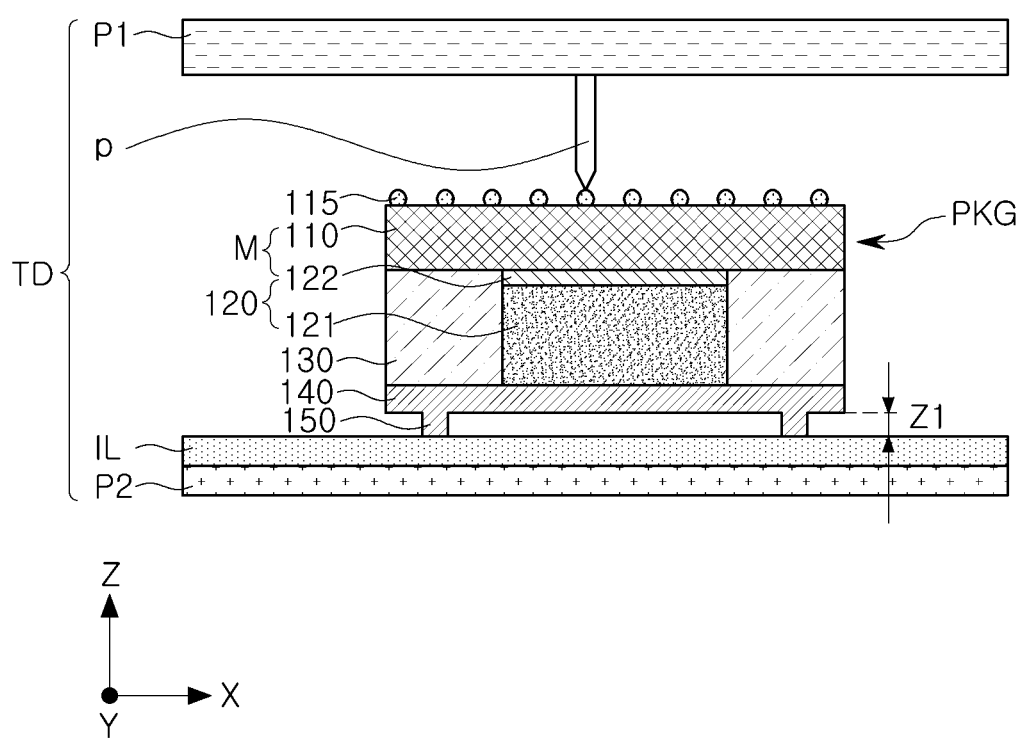
FIG. 6 is a cross-sectional diagram that illustrates a semiconductor package according to an example embodiment of the present disclosure.

FIG. 6 is a cross-sectional diagram that illustrates a semiconductor package according to an example embodiment.

FIG. 6 is a diagram that illustrates the semiconductor package PKG illustrated in FIG. 2 along with a test device TD for performing a CDM test on the semiconductor package PKG according to an example embodiment. For example, the semiconductor package PKG illustrated in FIG. 6 may be a simplified diagram in which the other components are omitted to mainly describe the plurality of uneven structures 150.

Referring to FIG. 6, the semiconductor package PKG may include a package board 110, a semiconductor chip 120, a molding member 130, and a heat dissipation member 140. Connection terminals 115 in the form of solder balls may be disposed on the upper surface of the package board 110, and the semiconductor chip 120 may include a board portion 121 formed of silicon and a wiring portion 122 including a plurality of metal wirings. The package board 110 and the wiring portion 122 may be defined as a metal portion M for ease of description.

However, the configuration and structure of the semiconductor package PKG illustrated in FIG. 6 is not necessarily limited to the illustrated examples. For example, the semiconductor package PKG may further include a bonding member and connection members. Also, the positions of the board portion 121 and the metal portion M may vary depending on the type of the semiconductor package PKG.

Similarly to the example illustrated in FIG. 3, the test device TD for performing the CDM test may include a ground plate P1, an electric field plate P2, an insulating layer IL, and a pogo pin p.

In the semiconductor package PKG illustrated in FIG. 6, a plurality of uneven structures 150 which may separate the heat dissipation member 140 from metals objects disposed in an external region of the heat dissipation member 140, for example, the electric field plate P2 of the test device TD, may be disposed on the upper surface of the heat dissipation member 140. The plurality of uneven structures 150 may affect the magnitude of capacitance formed between the heat dissipation member 140 and the electric field plate P2.

For example, the magnitude of the capacitance formed between the heat dissipation member 140 and the electric field plate P2 may be determined by the number of areas of the plurality of uneven structures 150 in a first direction (e.g., X direction) and in a second direction (e.g., Y direction), parallel to the upper surface of the package board 110, and a height of the plurality of uneven structures 150 in a third direction (e.g., the Z direction) perpendicular to the upper surface of the package board 110.

In the semiconductor package PKG according to FIG. 6, the plurality of uneven structures 150 may have a height of Z1 in the third direction. Accordingly, the distance between the heat dissipation member 140 and the electric field plate P2 may increase by Z1 as compared an the example in which the plurality of uneven structures 150 are not provided (e.g., the example illustrated in FIG. 3).

Referring to Equation 3, the magnitude C of the capacitance formed between a pair of conductive plates that oppose each other may be proportional to the area S of the conductive plate, and may be inversely proportional to a spacing distance D between the pair of conductive plates.

$$C = \varepsilon \frac{S}{D} \quad \text{[Equation 3]}$$

Here, ε may be a dielectric constant of a dielectric layer disposed between the pair of conductive plates that oppose each other.

Therefore, in the semiconductor package PKG according to FIG. 6, as the distance between the heat dissipation member 140 and the electric field plate P2 increases, the magnitude of the capacitance formed between the heat dissipation member 140 and the electric field plate P2 may decrease.

The distance between the upper surfaces of the plurality of uneven structures (e.g., the tops of the protrusions) 150 and the electric field plate P2 may be a thickness of the insulating layer IL. The distance between the heat dissipation member 140 and the electric field plate P2 may be the sum of a thickness of the insulating layer IL and the height of the plurality of uneven structures 150. Since the distance between the heat dissipation member 140 and the electric field plate P2 is greater than the distance between the upper surfaces of the plurality of uneven structures 150 and the electric field plate P2, the magnitude of the capacitance formed in the semiconductor package PKG may vary depending on the area of the upper surface of the uneven structures 150. For example, in some embodiments, the magnitude of the capacitance formed in the semiconductor package may increase with an increase in the area of the upper surface of the uneven structures 150.

As the sum of the areas of the upper surfaces of the plurality of uneven structures 150 decreases, the capacitance formed in relation to the semiconductor package PKG may decrease. Referring back to FIG. 1, since the plurality of uneven structures 150 are formed in the first region A1 of the semiconductor package PKG, as the area of the first region A1 decreases, magnitude of the capacitance formed in relation to the semiconductor package PKG may decrease.

Figure 7:
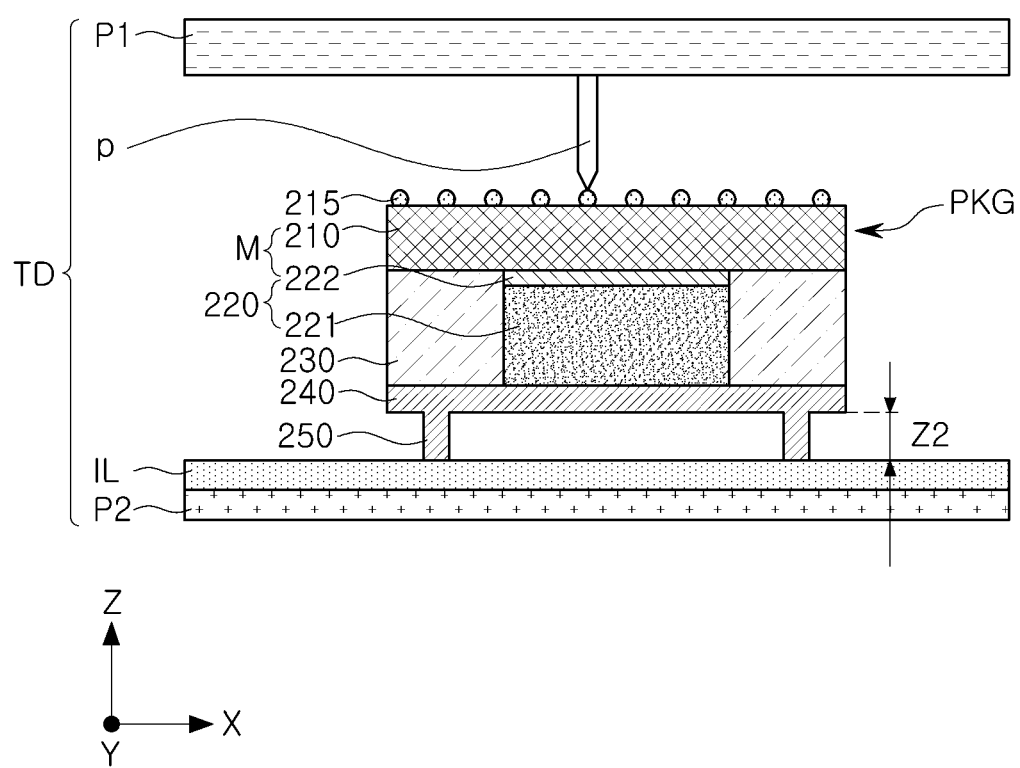
FIG. 7 is a cross-sectional diagram that illustrates a semiconductor package according to an example embodiment of the present disclosure.

FIG. 7 is a cross-sectional diagram that illustrates a semiconductor package according to an example embodiment.

Referring to FIG. 7, a semiconductor package PKG in an example embodiment may be similar to the semiconductor package PKG illustrated in FIG. 6. For example, the semiconductor package PKG may include at least one semiconductor chip 220 including a package board 210, a board portion 221, and a wiring portion 222 having solder ball-shaped connection terminals 215, a molding member 230, and a heat dissipation member 240 on an upper surface thereof. For example, the package board 210 and the wiring portion 222 may be defined as a metal portion M for ease of description.

Similarly to the example illustrated in FIG. 6, the test device TD for performing the CDM test may include a ground plate P1, an electric field plate P2, an insulating layer IL, and a pogo pin p.

In the semiconductor package according to FIG. 7, a plurality of uneven structures 250 which may separate the heat dissipation member 240 from metals disposed in an external region, such as, for example, the electric field plate P2 of the test device TD may be disposed on the upper surface of the heat dissipation member 240. A height of the plurality of uneven structures 250 in the third direction may be greater than a height of the plurality of uneven structures 150 illustrated in FIG. 6.

For example, the plurality of uneven structures 250 may have a height Z2, which is greater than Z1, in the third direction. Accordingly, the distance between the heat dissipation member 240 and the electric field plate P2 may increase by Z2 compared to an example in which the plurality of uneven structures 250 are not provided. Also, the distance between the heat dissipation member 240 and the electric field plate P2 may increase by (Z2–Z1) compared to the FIG. 6 example which includes the plurality of uneven structures 150 with a lower height.

As described above, referring to Equation 3, the magnitude of the capacitance formed between a pair of conductive plates that oppose each other may be proportional to the area of the conductive plate and may be inversely proportional to a spacing distance between the pair of conductive plates. Accordingly, as the height of the plurality of uneven structures 250 increases, the distance between the heat dissipation member 240 and the electric field plate P2 may increase, and accordingly, the magnitude of capacitance formed between the heat dissipation member 240 and the electric field plate P2 may decrease.

Figure 8A:
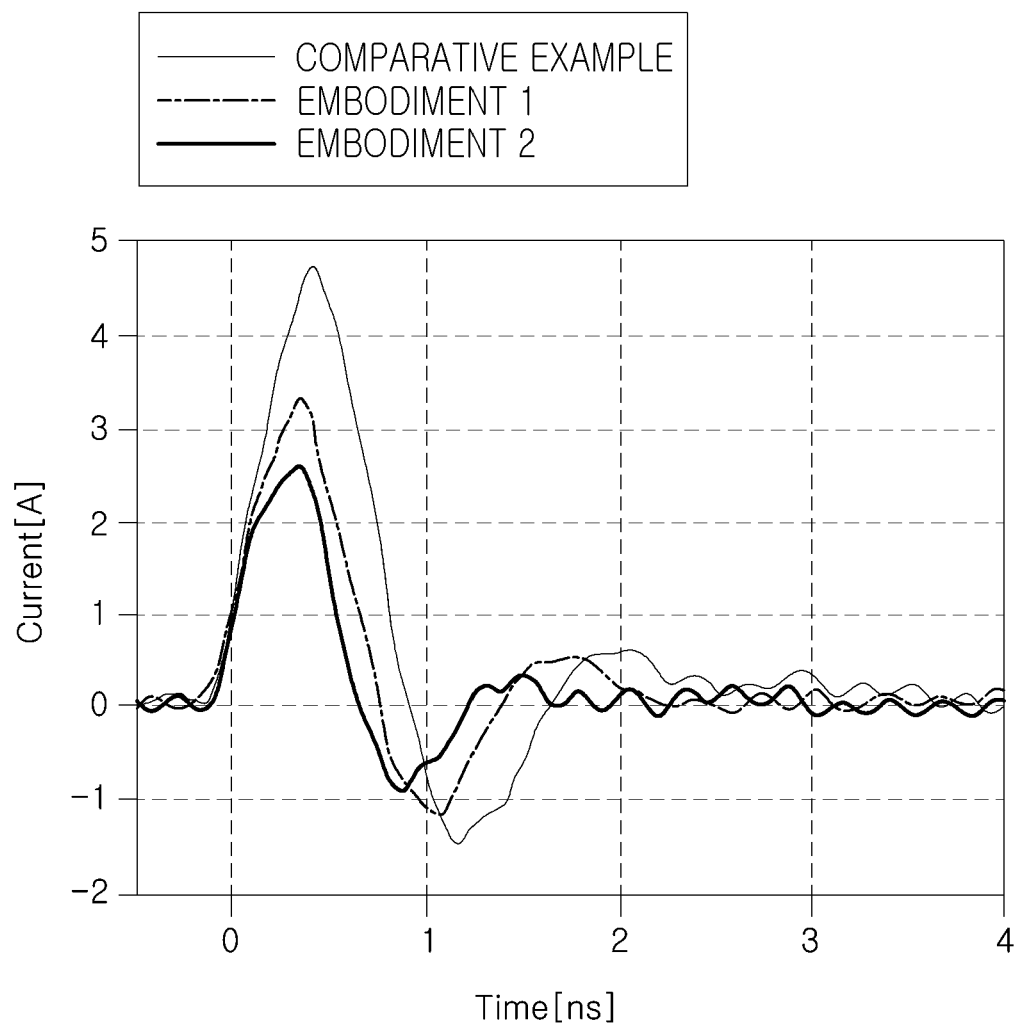
FIGS. 8A and 8B are diagrams that illustrate an effect of a semiconductor package according to an example embodiment of the present disclosure.
Figure 8B:
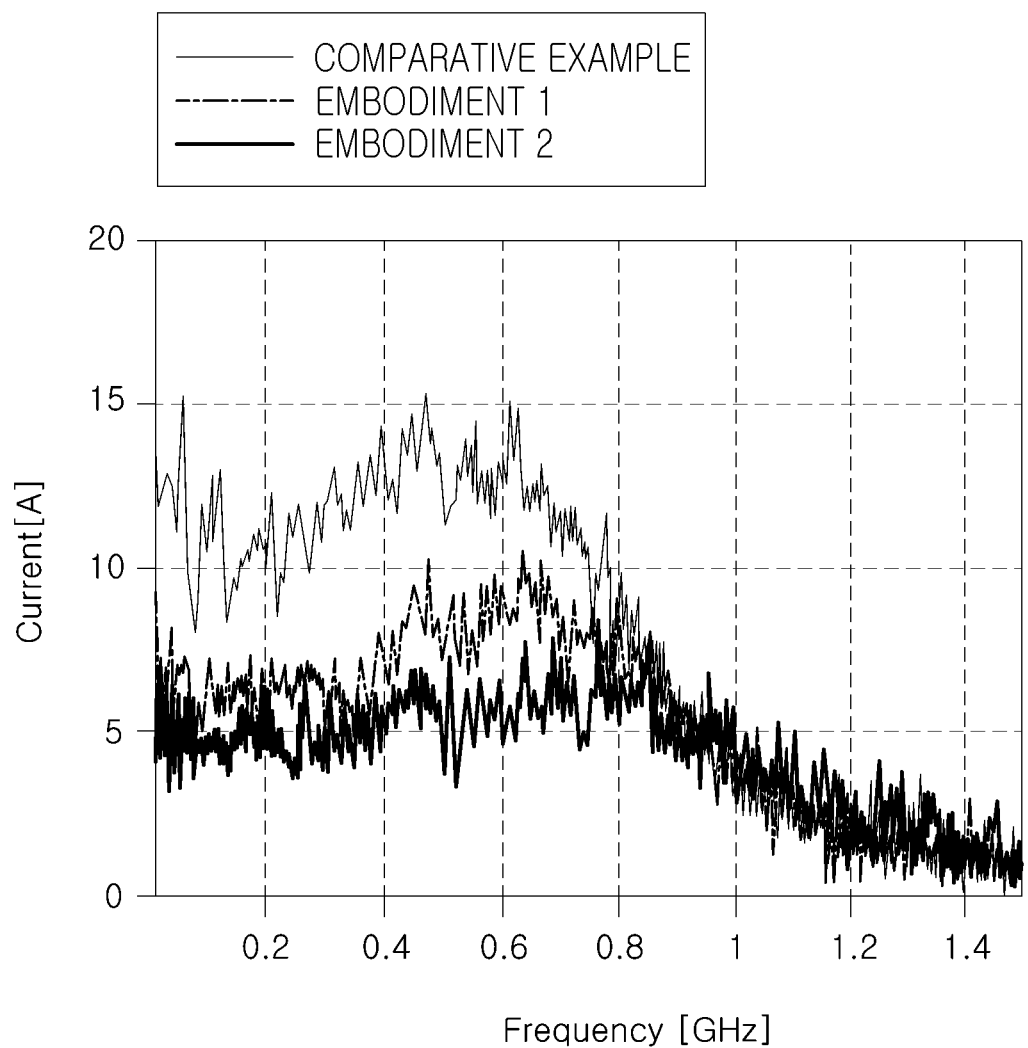

FIGS. 8A and 8B are diagrams that illustrate an effect of a semiconductor package according to an example embodiment.

FIG. 8A is a graph that represents an intensity of a discharged current in the time domain to compare CDM test results in comparative examples and embodiments. FIG. 8B is a graph that represents an intensity of a discharged current in the frequency domain to compare CDM test results in comparative examples and embodiments.

Referring to FIGS. 8A and 8B, a comparative example may be a result of the CDM test performed on the semiconductor package PKG not including the plurality of uneven structures, such as the semiconductor package PKG illustrated in FIG. 3. The embodiment 1 may be a result of the CDM test performed on the semiconductor package PKG including the plurality of uneven structures 150 having a height of Z1 illustrated in FIG. 6, and the embodiment 2 may be a result of the CDM test performed on the semiconductor package PKG including the plurality of uneven structures 250 having a height of Z2 greater than Z1 illustrated in FIG. 7.

For example, a maximum value of the intensity of current in embodiments 1 and 2 may be less than a maximum value of the intensity of current in the comparative example. According to the results of simulation in which Z1 is set to be 0.2 mm and Z2 is set to 0.5 mm, the maximum value of the intensity of current in embodiment 1 was about 30% less than the maximum value of the intensity of current in the comparative example. The maximum value of the intensity of the current in embodiment 2 was about 47% less than the maximum value of the intensity of the current in the comparative example. Accordingly, the semiconductor packages PKG according to the embodiments 1 and 2 underwent less electrical stress during the CDM test than the comparative example semiconductor package.

According to the simulation results, the intensity of the current discharged in the CDM test may increase to a maximum between 0 ns and 1 ns, and may then decrease. The time at which the intensity current is detected may be similar irrespective of the presence and height of the plurality of uneven structures 150 and 250. As the distance between the heat dissipation members 140 and 240 and the electric field plate P2 increases, a current having a maximum intensity may be detected at a higher frequency.

However, embodiments are not necessarily limited thereto. For example, the heights of the plurality of uneven structures 150 and 250 may vary, and accordingly, the intensity of current based on discharging may also vary. Also, even when the heights of the plurality of uneven structures 150 and 250 are the same, the intensity of the current based on discharging may vary depending on the environment. Also, the graph of the intensity of the discharged current in the time domain and the frequency domain may vary depending on the environment.

Figure 9A:
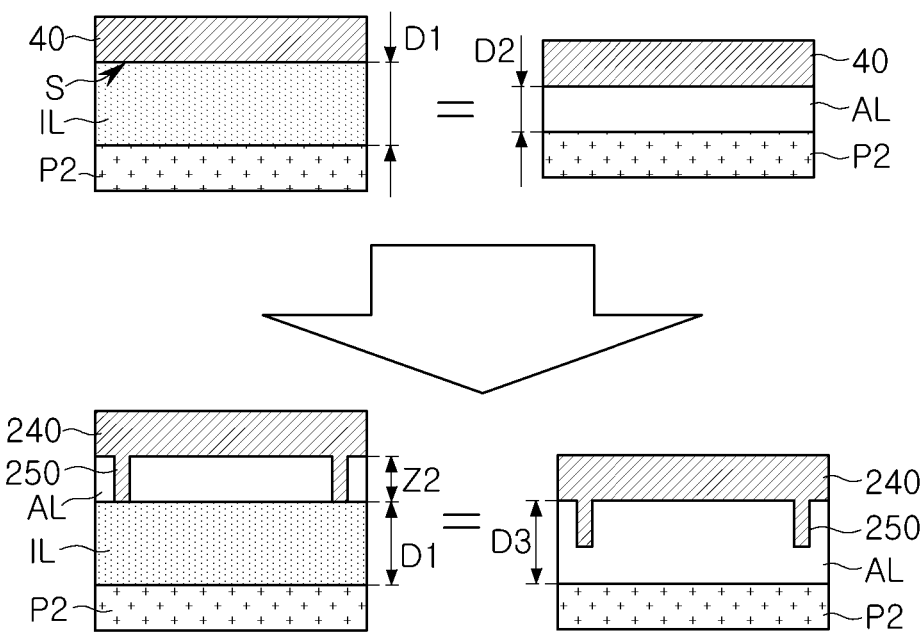
FIGS. 9A and 9B are diagrams that illustrate effects of varying implementations of a semiconductor package according to an example embodiment of the present disclosure.
Figure 9B:
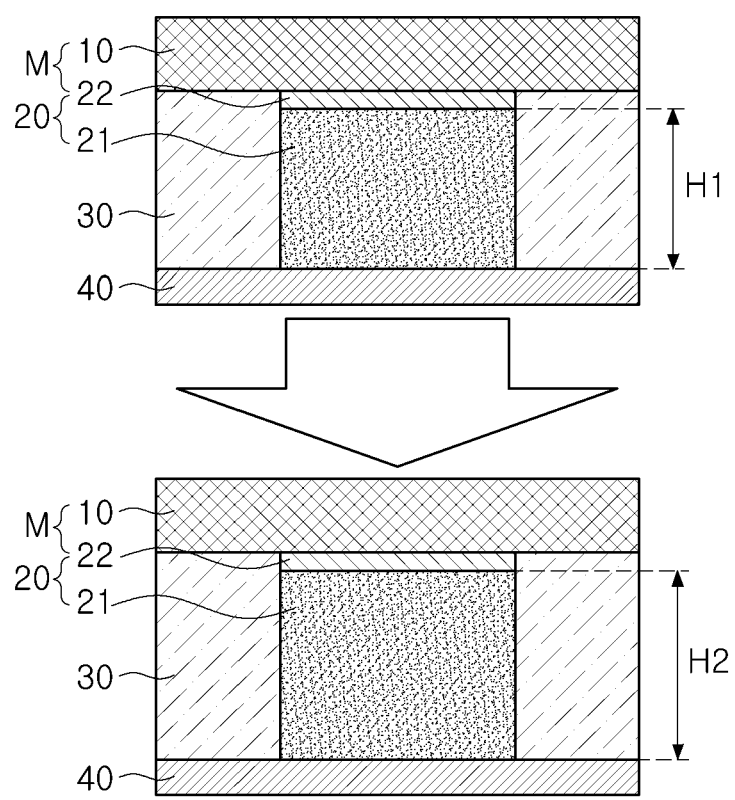

FIGS. 9A and 9B are diagrams that illustrate effects of varying implementations of a semiconductor package according to an example embodiment.

Referring to FIGS. 3 and 9A, in a semiconductor package PKG that does not include a plurality of uneven structures, the distance between the heat dissipation member 40 and the electric field plate P2 may be D1. A distance between the heat dissipation member 40 and the electric field plate P2 may be the same as the thickness of the insulating layer IL included in the test device TD.

Referring to Equation 3, the magnitude of the capacitance formed between the heat dissipating member 40 and the electric field plate P2 may be proportional to the area S of the upper surface of the heat dissipating member 40 which opposes the electric field plate P2, and to a dielectric constant of the insulating layer IL disposed between the heat dissipation member 40 and the electric field plate P2. The magnitude of capacitance may be inversely proportional to the thickness of the insulating layer IL.

When an equivalent capacitance is formed in the semiconductor package PKG having an air layer AL as a dielectric layer instead of an insulating layer IL, the distance between the heat dissipating member 40 and the electric field plate P2 may be different. For example, when the dielectric constant of the insulating layer IL is greater than the dielectric constant of the air layer AL, the distance between the heat dissipation member 40 and the electric field plate P2, that is, the thickness of the air layer AL may be D2 smaller than D1. In other words, when the semiconductor package PKG is implemented with an air layer AL instead of an insulating layer IL, the air layer may be less thick in order to reach the same or similar capacitance to a semiconductor package implemented with an insulating layer IL.

Referring back to FIG. 7, in the semiconductor package PKG in an example embodiment, a plurality of uneven structures 250 having a height of Z2 may be disposed on the upper surface of the heat dissipation member 240. For example, the distance between the heat dissipation member 240 and the electric field plate P2 in the semiconductor package PKG may be the sum of D1 and Z2.

When the equivalent capacitance is formed in the semiconductor package PKG having the air layer AL as a dielectric layer instead of the insulating layer IL, the distance between the heat dissipation member 240 and the electric field plate P2 may be different. For example, the distance between the heat dissipation member 240 and the electric field plate P2 may be D3. Since the air layer AL is disposed between the plurality of uneven structures 250, D3 may be the sum of D2 and Z2.

Referring to Equation 4, the semiconductor package PKG according to the embodiments illustrated in the lower half of FIG. 9A may include the plurality of uneven structures 250 with the height of Z2, and accordingly the magnitude of the capacitance formed between the heat dissipation member 240 and the electric field plate P2 may decrease to X1 times the magnitude of the embodiments illustrated in the upper half of FIG. 9A without the plurality of uneven structures 250.

$$X1 = \frac{D2}{D2 + Z2} \qquad \text{[Equation 4]}$$

Referring to FIGS. 4 and 9B, by increasing the height of the molding member 30 and increasing the height of the board portion 21 of the semiconductor chip 20 in the semiconductor package PKG that does not include the plurality of uneven structures, a similar decrease in capacitance effect to that of the semiconductor package PKG including the plurality of uneven structures 250, e.g., a lowered overall capacitance of the semiconductor package PKG, may be expected.

For example, when the height of the board portion 21 increases from H1 to H2, the distance between the metal portion M and the heat dissipation member 40 may increase, such that C1 corresponding to the magnitude of the capacitance formed between the semiconductor package PKG and the electric field plate P2 may decrease. Accordingly, the magnitude of the equivalent capacitance Ceq related to the semiconductor package PKG may decrease, and further, damage to the semiconductor package PKG caused by discharging may be prevented.

Referring to Equation 5, in the semiconductor package PKG in which the heights of the molding member 30 and the board portion 21 are increased, the magnitude of the capacitance formed between the metal portion M and the heat dissipation member 40 may decrease to X2 times that of the semiconductor package PKG in which the heights of the molding member 30 and the board portion 21 are not increased.

$$X2 = \frac{H1}{H2} \qquad \text{[Equation 5]}$$

However, when the heights of the molding member 30 and the board portion 21 are increased, efficiency of the manufacturing may decrease as compared to semiconductor packages PKG in which the plurality of uneven structures 250 are used, such as the example of FIG. 7, due to a difference in dielectric constants between the air layer AL and the molding member 30, and the board portion 21. Accordingly, by using the semiconductor package PKG in the example embodiment, additional resources may be reduced, and electrical stress applied to the semiconductor package PKG may be reduced.

Figure 10:
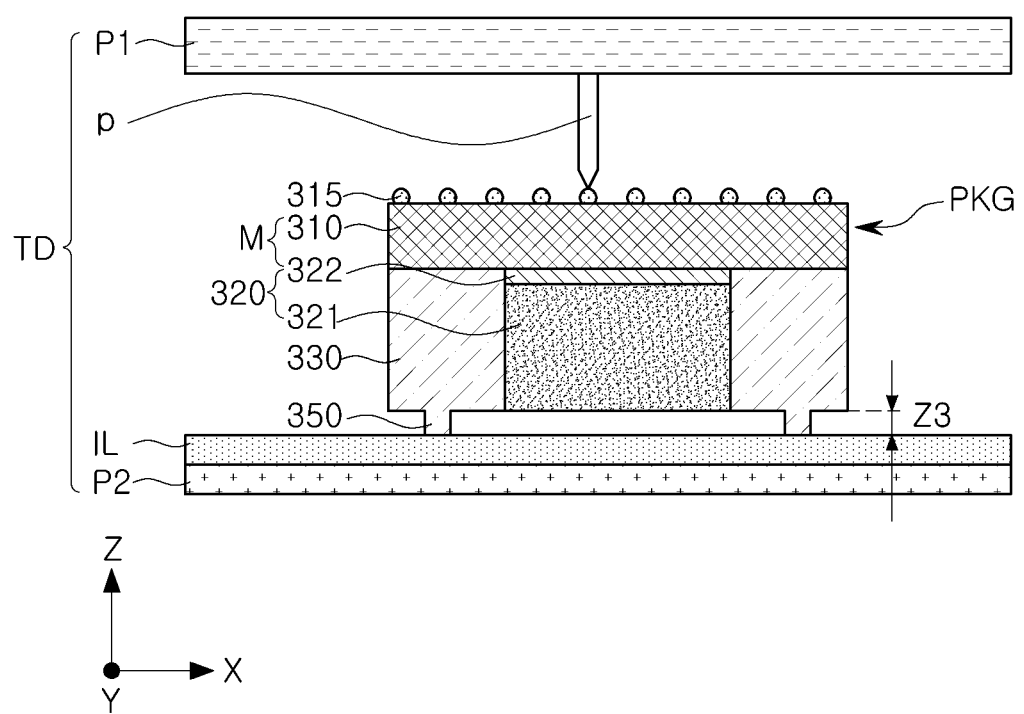
FIG. 10 is a cross-sectional diagram that illustrates a semiconductor package according to an example embodiment of the present disclosure.
Figure 11:
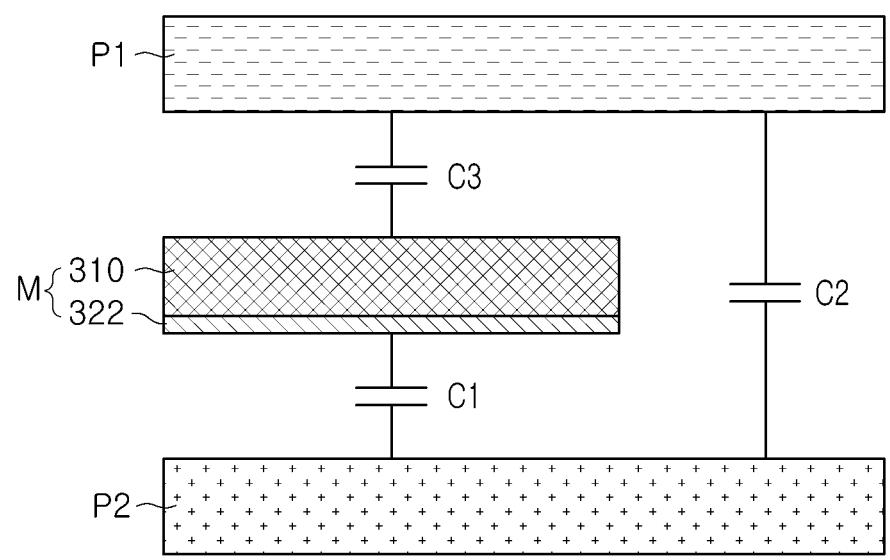
FIG. 11 is a diagram that illustrates capacitance formed between components when an electrostatic test is performed on a semiconductor package.

FIG. 10 is a cross-sectional diagram that illustrates a semiconductor package according to an example embodiment. FIG. 11 is a diagram that illustrates capacitance formed between components when an electrostatic test is performed on a semiconductor package.

Referring to FIG. 10, a semiconductor package PKG in an example embodiment may be similar to to the semiconductor package PKG illustrated in FIG. 6. For example, the semiconductor package PKG may include at least one semiconductor chip 320 including a package board 310, a board portion 321, and a wiring portion 322 having solder ball-shaped connection terminals 315 disposed on an upper surface thereof, and a molding member 330. The package board 310 and the wiring portion 322 may be defined as a metal portion M for ease of description. The test device TD for performing the CDM test may include a ground plate P1, an electric field plate P2, an insulating layer IL, and a pogo pin p.

However, the semiconductor package PKG according to an example embodiment may not include the heat dissipation member 140 including the plurality of uneven structures 150. In this embodiment, the upper surface structure of the semiconductor package PKG may be configured as the molding member 330, and the molding member 330 may include a plurality of uneven structures 350 disposed on the upper surface thereof. For example, the plurality of uneven structures 350 may be formed on the upper surface of the molding member 330 when the molding member 330 is manufactured.

The plurality of uneven structures 350 may correspond to the plurality of uneven structures 150 included in the semiconductor package PKG illustrated in FIG. 6. For example, the molding member 330 may include a first region having a plurality of uneven structures 350 having a predetermined height Z3 in a direction opposite to the semiconductor chip 320, and a second region separated from an external region by the plurality of uneven structures 350.

The plurality of uneven structures 350 may be spaced apart from each other in a first direction (e.g., X direction) and a second direction (e.g., Y direction), parallel to the upper surface of the package board 310. In the example embodiment, the area of the first region in which the plurality of uneven structures 350 are disposed may be smaller than the area of the second region.

Referring to FIG. 11, the amount of electric charges accumulated and discharged in the semiconductor package PKG may be determined by the magnitude of equivalent capacitance formed between the semiconductor package PKG and metals disposed in the external region of the semiconductor package PKG. As an example, the equivalent capacitance may be modeled by being determined by a combination of C1, C2, and C3.

Since the semiconductor package PKG illustrated in FIG. 10 does not include a heat dissipation member, the capacitance formed between the metal portion M and the electric field plate P2 may be C1, and the capacitance formed between the ground plate P1 and the electric field plate P2 may be C2. The capacitance formed between the ground plate P1 and the metal portion M may be C3.

The semiconductor package PKG in the embodiment according to FIG. 10 may decrease the magnitude of the equivalent capacitance by decreasing C1 among C1, C2, and C3 included in the modeled equivalent capacitance. For example, by increasing the distance between the semiconductor package PKG and metals in the external region of the semiconductor package PKG using the plurality of uneven structures, the amount of electric charges charged in the semiconductor package PKG may decrease.

Figure 12:
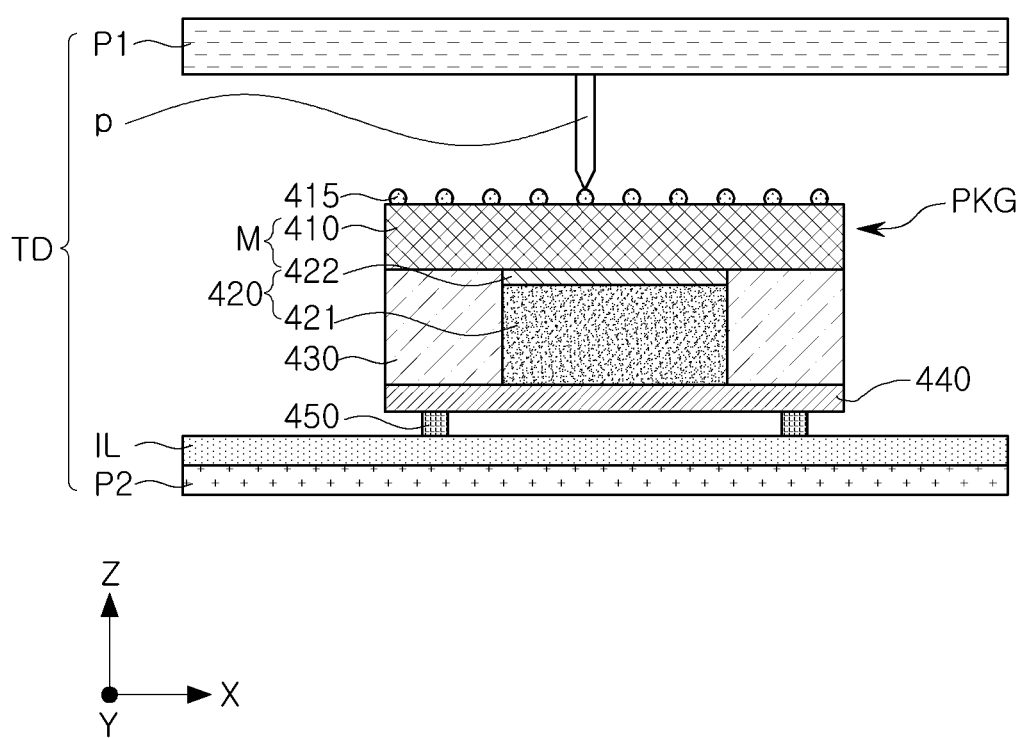
FIG. 12 is a cross-sectional diagram that illustrates a semiconductor package according to an example embodiment of the present disclosure.
Figure 13:
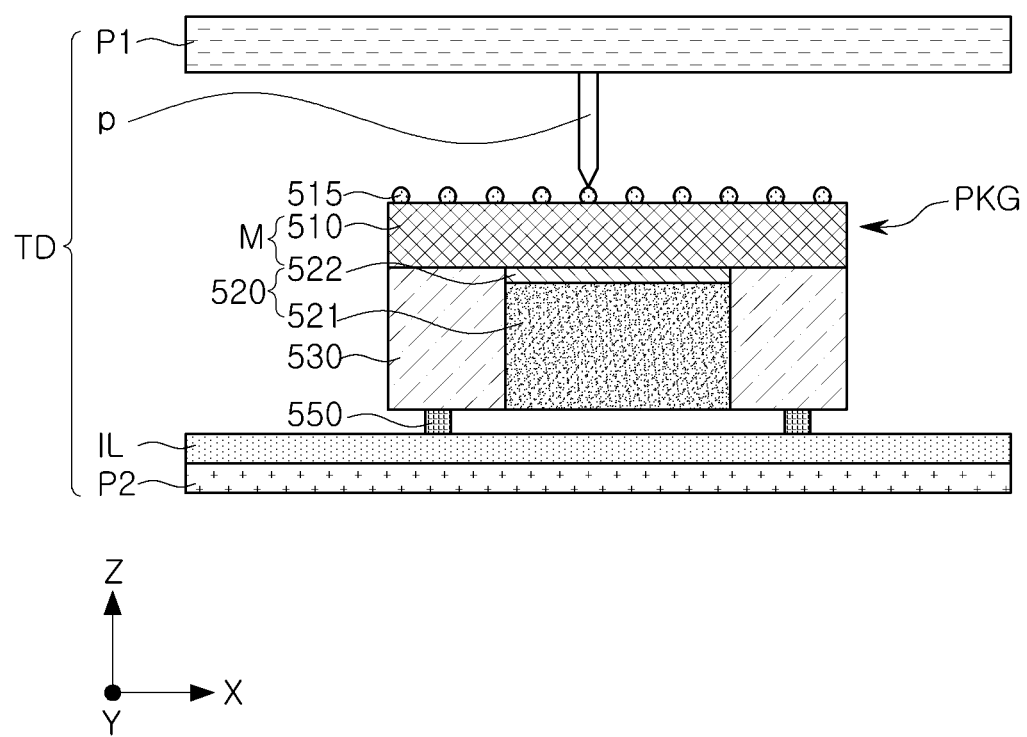
FIG. 13 is a cross-sectional diagram that illustrates a semiconductor package according to an example embodiment of the present disclosure.

FIG. 12 is a cross-sectional diagram that illustrates a semiconductor package according to an example embodiment. FIG. 13 is a cross-sectional diagram that illustrates a semiconductor package according to an example embodiment.

The semiconductor packages PKG illustrated in FIGS. 12 and 13 may be similar to the semiconductor packages PKG illustrated in FIGS. 6 and 10, respectively. For example, the semiconductor package PKG illustrated in FIG. 12 may include a heat dissipation member 440, and the semiconductor package PKG illustrated in FIG. 13 may not include a heat dissipation member.

Referring to FIGS. 12 and 13, the semiconductor package PKG may include package boards 410 and 510, at least one semiconductor chip 420 and 520, molding members 430 and 530, and a plurality of uneven structures 450 and 550.

Connection terminals 415 and 515 in the form of solder balls may be disposed on the upper surface of the package boards 410 and 510, and at least one semiconductor chip 420 and 520 may include board portions 421 and 521 formed of silicon, and wiring portions 422 and 522 including a plurality of metal wirings.

The package boards 410 and 510 and the wiring portions 422 and 522 may be defined as a metal portion M for ease of description. The test device TD for performing the CDM test may include a ground plate P1, an electric field plate P2, an insulating layer IL, and a pogo pin p.

However, differently from the semiconductor package PKG illustrated in FIG. 13, the semiconductor package PKG illustrated in FIG. 12 may include a heat dissipation member 440. Accordingly, the components in which the plurality of uneven structures 450 and 550 are disposed may be different between the semiconductor package PKG illustrated in FIG. 12 and the semiconductor package PKG illustrated in FIG. 13.

In the embodiments according to FIGS. 12 and 13, the plurality of uneven structures 450 and 550 may be separately manufactured to be formed of a material different from those of the other components. The plurality of uneven structures 450 and 550 which are separately manufactured may be attached to the upper surface structure of the semiconductor package PKG at the end of or during the process of manufacturing the semiconductor package PKG.

For example, the plurality of uneven structures 450 which are separately manufactured in the semiconductor package PKG illustrated in FIG. 12 may be attached to the upper surface of the heat dissipation member 440. The plurality of uneven structures 550 which are separately manufactured in the semiconductor package PKG illustrated in FIG. 13 may be attached to the upper surface of the molding member 530.

However, the structures of the semiconductor packages PKG illustrated in FIGS. 12 and 13 are not necessarily limited to the illustrated examples. For example, the shape and arrangement of the components included in the semiconductor package PKG may vary, and the shape and arrangement of the plurality of uneven structures 450 and 550 may also vary.

Figure 14:
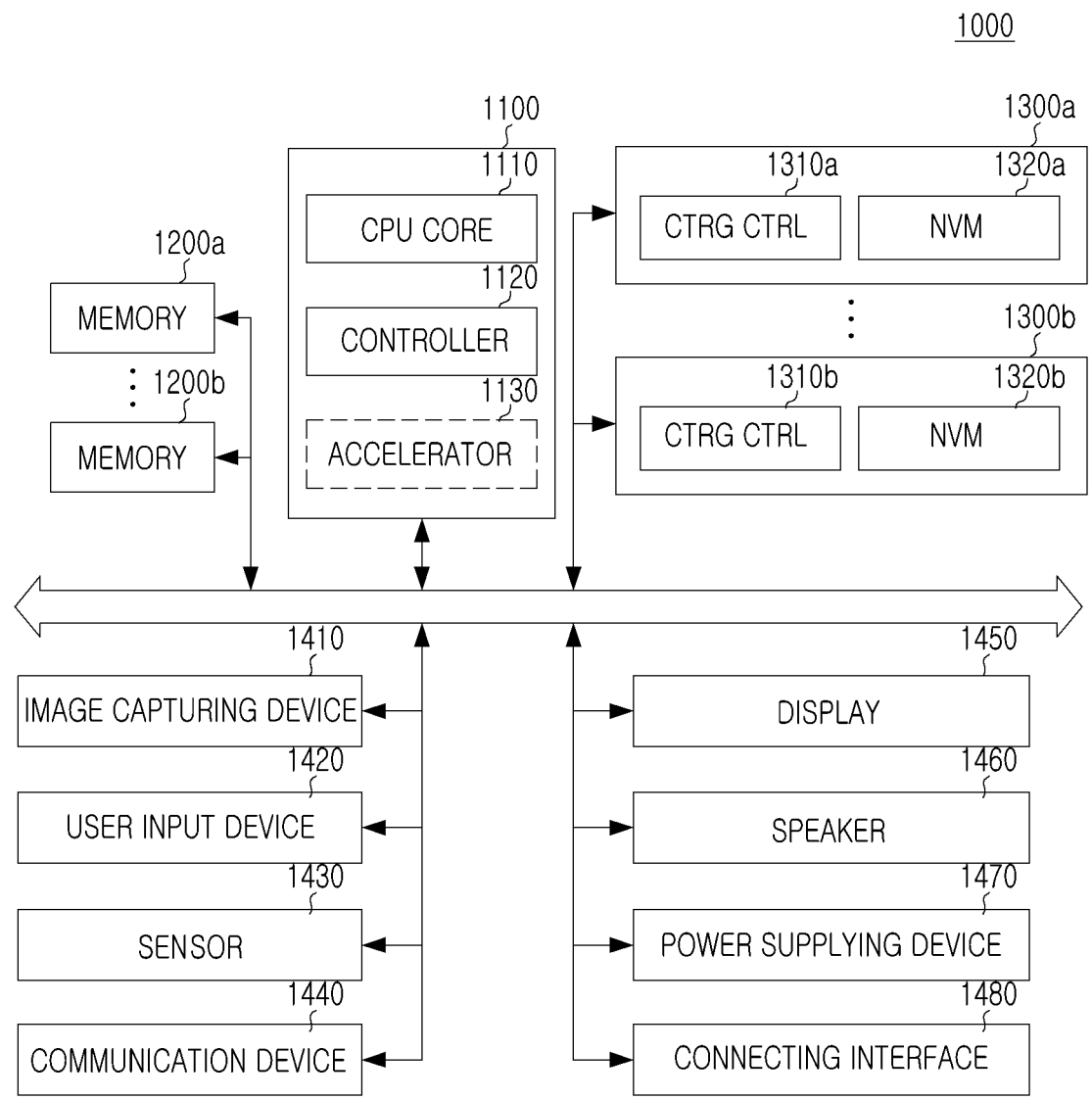
FIG. 14 is a block diagram that illustrates a system applied to a semiconductor package according to an example embodiment of the present disclosure.

FIG. 14 is a block diagram that illustrates a system applied to a semiconductor package according to an example embodiment.

A system 1000 in FIG. 14 may be implemented as a mobile system such as a mobile phone, a smart phone, a tablet personal computer (PC), a wearable device, a healthcare device, or an Internet of things (IOT) device. However, the system 1000 in FIG. 14 is not necessarily limited to a mobile system, and may be implemented as a personal computer, a laptop computer, a server, a media player, or an automotive device such as a navigation system.

Referring to FIG. 14, the system 1000 may include a main processor 1100, memories 1200a and 1200b, and storage devices 1300a and 1300b, and may further include an image capturing device 1410, a user input device 1420, a sensor 1430, a communication device 1440, a display 1450, a speaker 1460, a power supplying device 1470, and/or a connecting interface 1480.

The main processor 1100 may control overall operation of the system 1000, more specifically, the operation of the other components included in the system 1000. The main processor 1100 may be implemented as a general-purpose processor, a dedicated processor, or an application processor.

The main processor 1100 may include one or more CPU cores 1110, and may further include a controller 1120 for controlling the memories 1200a, 1200b and/or the storage devices 1300a, 1300b. In example embodiments, the main processor 1100 may further include an accelerator 1130 which may be a dedicated circuit for high-speed data operations such as artificial intelligence (AI) data operation. The accelerator 1130 may include a graphics processing unit (GPU), a neural processing unit (NPU), and/or a data processing unit (DPU), and may be implemented as a chip that is independent from the other components of the main processor 1100.

The memories 1200a and 1200b may be used as main memories of the system 1000, and may include volatile memory such as SRAM and/or DRAM, or may include a nonvolatile memory such as a flash memory, PRAM and/or RRAM. The memories 1200a and 1200b may be implemented in the same package as the main processor 1100.

The storage devices 1300a and 1300b may function as nonvolatile storage devices for storing data regardless of whether power is supplied, and may have relatively large storage capacity as compared to the memories 1200a and 1200b. The storage devices 1300a and 1300b may include storage controllers 1310a and 1310b and nonvolatile memory (NVM) 1320a and 1320b for storing data under the control of the storage controllers 1310a and 1310b. The nonvolatile memories 1320a and 1320b may include a flash memory having a 2-dimensional (2D) structure or a 3-dimensional (3D) V-NAND (Vertical NAND) structure, but may include other types of nonvolatile memories such as PRAM and/or RRAM.

The storage devices 1300a and 1300b may be included in the system 1000, and may be physically spaced apart from the main processor 1100, or may be implemented in the same package as the main processor 1100. The storage devices 1300a and 1300b may have the same shape as a solid state device (SSD) or a memory card, such that the storage devices 1300a and 1300b may be combined to be detached or attached to the other components of the system 1000 through an interface such as a connection interface 1480. The storage devices 1300a and 1300b may be based on standard protocols such as universal flash storage (UFS), embedded multi-media card (eMMC), or nonvolatile memory express (NVMe), but embodiments are not necessarily limited thereto.

The image capturing device 1410 may capture a still image or a moving image, and may be implemented as a camera, a camcorder, and/or a webcam.

The user input device 1420 may receive various types of data input from a user of the system 1000, and may be implemented as a touch pad, a keypad, a keyboard, a mouse, and/or a microphone.

The sensor 1430 may sense various types of physical quantities which may be obtained externally from the system 1000, and may convert the sensed physical quantities into electrical signals. The sensor 1430 may include a temperature sensor, a pressure sensor, an illuminance sensor, a position sensor, an acceleration sensor, a biosensor, and/or a gyroscope sensor.

The communication device 1440 may transmit and receive signals between external devices present externally of the system 1000 depending on various communications protocols. The communication device 1440 may include an antenna, a transceiver, and/or a modem (MODEM).

The display 1450 and the speaker 1460 may function as output devices for outputting visual information and auditory information to a user of the system 1000, respectively.

The power supplying device 1470 may appropriately convert power supplied from a battery embedded in the system 1000 and/or an external power source and may supply the converted power to each component of the system 1000.

The connection interface 1480 may provide connection between the system 1000 and an external device connected to the system 1000 and exchanging data with the system 1000. The connection interface 1480 may be implemented as various interface methods such as advanced technology attachment (ATA), serial ATA (SATA), external SATA (e-SATA), small computer small interface (SCSI), serial attached SCSI (SAS), peripheral component interconnection (PCI), PCI express (PCIe), NVMe, IEEE 1394, universal serial bus (USB), secure digital (SD) card, multi-media card (MMC), eMMC, UFS, embedded universal flash storage (eUFS), compact flash (CF) card interface.

The system 1000 illustrated in FIG. 14 may be applied to the semiconductor package in the embodiments described herein. For example, the plurality of uneven structures may be formed on the surfaces of semiconductor packages to which the system 1000 is applied. The plurality of uneven structures may reduce capacitance formed between the semiconductor packages and the external metals. Accordingly, electric charges accumulated in the semiconductor package to which the system 1000 is applied may decrease, and development cost and delay in a development period of the semiconductor package may be reduced. Further, a system manufactured according to embodiments of the present disclosure may have a reduced incidence of damages that occur in the manufacturing process.

Figure 15:
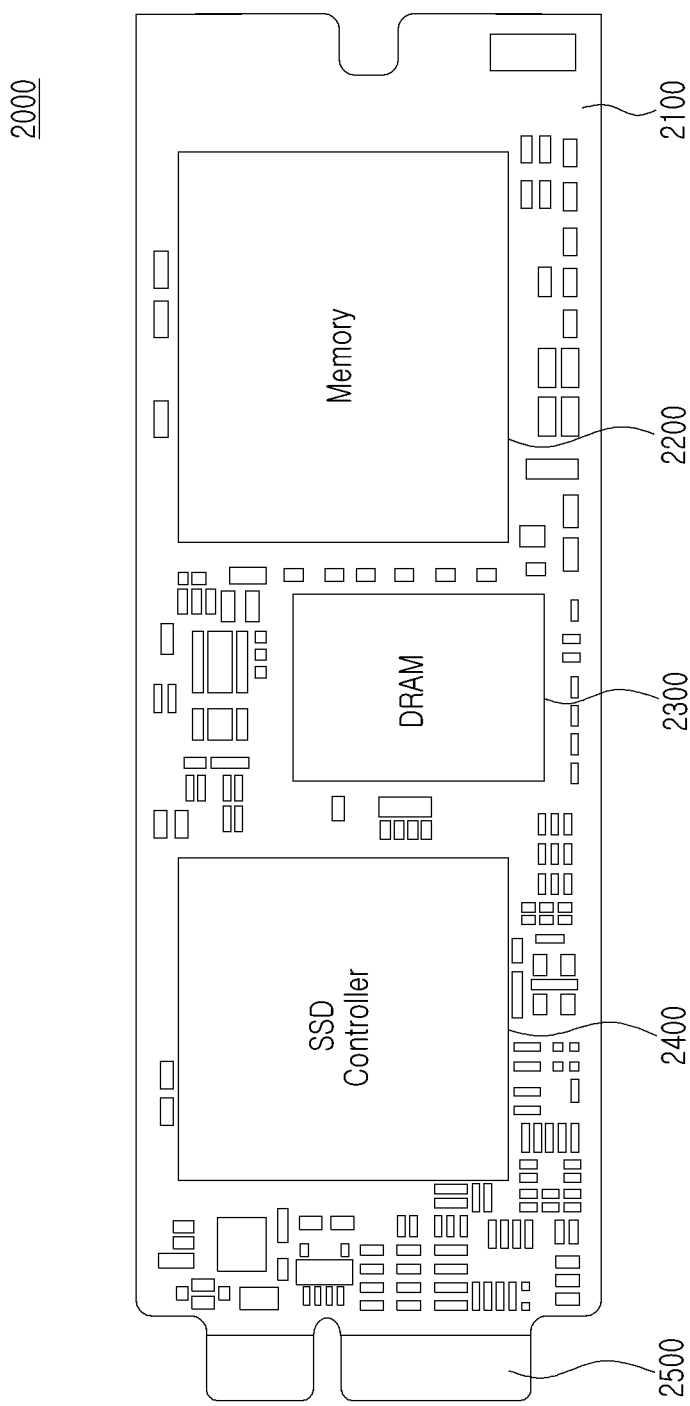
FIG. 15 is a diagram that illustrates an electronic device including a semiconductor package according to an example embodiment of the present disclosure.

FIG. 15 is a diagram that illustrates an electronic device including a semiconductor package according to an example embodiment.

Referring to FIG. 15, an electronic device 2000 including a semiconductor package according to an example embodiment may include a main board 2100, a memory package 2200, an auxiliary memory package 2300, and a controller package 2400. The memory package 2200, the auxiliary memory package 2300, and the controller package 2400 may be mounted on the main board 2100. For example, the electronic device 2000 may be configured as an SSD device. Accordingly, the memory package 2200 may include a plurality of semiconductor chips, such as, for example, flash memory chips, the auxiliary memory package 2300 may include at least one DRAM chip, and the controller package 2400 may include an SSD controller. However, embodiments are not necessarily limited thereto, and the electronic device 2000 may not be limited to an SSD device.

Also, the configuration of the electronic device 2000 illustrated in FIG. 15 is merely an example embodiment and embodiments are not necessarily limited thereto. As an example, the electronic device 2000 illustrated in FIG. 15 may include the memory package 2200 configured as a single package, but embodiments are not necessarily limited thereto, and the electronic device 2000 may include a memory package 2200 configured as at least one package.

The memory package 2200, the auxiliary memory package 2300, and the controller package 2400 may each be mounted on the main board 2100 through an external connection terminal such as a bump or a solder ball by a ball grid array (BGA) method. However, embodiments are not necessarily limited thereto. For example, the packages included in the electronic device 2000 may be mounted on the main board 2100 by a pin grid array (PGA) method, a tape carrier package (TCP) method, a chip-on-board (COB) method, a quad flat non-leaded (QFN) method.

The memory package 2200 may be configured similar to the semiconductor package according to example embodiments described herein. For example, the memory package 2200 may include a plurality of uneven structures on the surface thereof. The plurality of uneven structures may reduce capacitance formed between the memory package 2200 and external metals. Accordingly, electric charges accumulated in the memory package 2200 included in the SSD device 2000 may be reduced, and damages to the memory package 2200 may be reduced.

The auxiliary memory package 2300 may be configured as an auxiliary memory device, may be implemented as a DRAM 2300, and may work as a buffer in data exchange between the SSD controller 2400 and the memory package 2200.

The controller package 2400 may be implemented as an SSD controller, and may include a plurality of channels. The controller package 2400 may control the semiconductor chips in the memory package 2200 by applying various control signals to the memory package 2200. The controller package 2400 may be configured to transmit signals to and receive signals from an external device according to a protocol, such as a serial advanced technology attachment (SATA) standard, a parallel advanced technology attachment (PATA) standard, or a small computer system interface (SCSI) standard. The SATA standard may include SATA-1 and also all SATA family standards such as SATA-2, SATA-3, and e-SATA (external SATA). The PATA standard may encompass all IDE family standards such as integrated drive electronics (IDE) and enhanced-IDE (E-IDE).

In the electronic device 2000 including the semiconductor package in an example embodiment, the auxiliary memory package 2300 and/or the controller package 2400 may include a plurality of uneven structures on the surfaces thereof, similarly to the memory package 2200. The plurality of uneven structures may reduce the capacitance formed between the auxiliary memory package 2300 and/or the controller package 2400 and external metals. Accordingly, electric charges accumulated in the packages included in the electronic device 2000 may be reduced, and damages to the packages may be reduced.

The main board 2100 may be implemented as a printed circuit board, a flexible printed circuit board, or a tape board. The main board 2100 may include, for example, a core board having an upper surface and a lower surface, and a resin layer formed on the upper surface and the lower surface thereof. The resin layers may be formed in a multilayered structure, and a signal layer, a grounding layer, or a power source layer forming a wiring pattern may be disposed between the multilayered structures. A wiring pattern may be formed on the resin layer. In the drawing, the plurality of small rectangular patterns displayed on the main board 2100 may refer to a plurality of passive devices. An interface 2500 for communicating with an external device may be formed on one side of the main board 2100.

According to the aforementioned example embodiments, the semiconductor package may include a plurality of uneven structures on a surface thereof, thereby reducing the capacitance formed between the semiconductor package and adjacent external metals.

The semiconductor package may reduce additional development costs and delay in development period of the semiconductor package, and may reduce the electric charges accumulated in the semiconductor package in the manufacturing process.

While the example embodiments have been illustrated and described above, it will be apparent to those skilled in the art that modifications and variations could be made without departing from the scope of the present disclosure as defined by the appended claims.

What is claimed is:

1. A semiconductor package, comprising:
a package board;
at least one semiconductor chip disposed on the package board;
a molding member disposed on the package board and at least partially surrounding the at least one semiconductor chip; and
a heat dissipation member disposed on the at least one semiconductor chip and the molding member, and including an outward surface including a first region in which a plurality of uneven structures is disposed, and a second region,
wherein each of the plurality of uneven structures protrudes to a predetermined height in an outward direction away from the at least one semiconductor chip and the molding member, and is spaced apart from a proximate structure of the plurality of uneven structures in a first direction and a second direction,
wherein the first direction and the second direction are each parallel to the upper surface of the package board,
wherein the semiconductor package is disposed on an electric field plate and the predetermined height of each of the plurality of uneven structures affects a spacing between the heat dissipation member and the electric field plate.

2. The semiconductor package of claim 1, wherein an area of the first region in the first and second direction is smaller than an area of the second region in the first direction and the second direction.

3. The semiconductor package of claim 1, wherein the second region is disposed in a central portion of the heat dissipation member, and wherein the first region is disposed in an outer portion of the heat dissipation member.

4. The semiconductor package of claim 3, wherein the first region is disposed adjacent to corners of the heat dissipation member.

5. The semiconductor package of claim 1, wherein the plurality of uneven structures includes four uneven structures.

6. The semiconductor package of claim 5, wherein, among the plurality of uneven structures, two uneven structures are disposed in the first direction and two uneven structures are also disposed in the second direction.

7. The semiconductor package of claim 1, wherein the plurality of uneven structures is formed of a material different from a material of the heat dissipation member.

8. The semiconductor package of claim 1, further comprising:
a bonding member disposed between the molding member and the heat dissipation member.

9. The semiconductor package of claim 1, wherein the at least one semiconductor chip is disposed parallel to an upper surface of the package board.

10. The semiconductor package of claim 1, wherein the at least one semiconductor chip includes two or more semiconductor chips, which are stacked in a third direction perpendicular to an upper surface of the package board.

11. The semiconductor package of claim 1, wherein the electric field plate is configured for use in performing a charge device module (CDM) test on the semiconductor package.

12. A semiconductor package, comprising:
a package board;
at least one semiconductor chip disposed on the package board;
a molding member disposed on the package board and at least partially surrounding the at least one semiconductor chip; and
a heat dissipation member disposed on the at least one semiconductor chip and the molding member, and including an outward surface including a first region in which a plurality of uneven structures is disposed, and a second region,
wherein each of the plurality of uneven structures protrudes to a predetermined height in an outward direction away from the at least one semiconductor chip and the molding member, and is spaced apart from a proximate structure of the plurality of uneven structures in a first direction and a second direction,
wherein the first direction and the second direction are each parallel to the upper surface of the package board, and
wherein a magnitude of capacitance formed between the heat dissipation member and a metal object external to the semiconductor package is influenced by the plurality of uneven structures.

13. The semiconductor package of claim 12, wherein, as the predetermined height of the plurality of uneven structures increases, the capacitance decreases.

14. The semiconductor package of claim 12, wherein, as the area of the first region including the plurality of uneven structures decreases, the capacitance decreases.

15. A semiconductor package, comprising:
a package board;
at least one semiconductor chip disposed on the package board; and
a molding member disposed on the package board and at least partially surrounding the at least one semiconductor chip, and including a first region in which a plurality of uneven structures is disposed, and a second region spaced apart from an external region by the plurality of uneven structures,
wherein each of the plurality of uneven structures protrudes to a predetermined height in an outward direction away from the semiconductor chip, and is spaced apart from a proximate structure of the plurality of uneven structures in a first direction and a second direction,
wherein the first direction and the second direction are each parallel to an upper surface of the package board, and
wherein the semiconductor package is disposed on an electric field plate and the predetermined height of each of the plurality of uneven structures affects a spacing between the heat dissipation member and the electric field plate.

16. The semiconductor package of claim 15, wherein an area of the first region in the first direction and the second direction is smaller than an area of the second region in the first direction and the second direction.

17. The semiconductor package of claim 16, wherein the plurality of uneven structures is formed of a material that is different from a material of the molding member on the molding member.

18. A semiconductor package, comprising:
a package board;
at least one semiconductor chip disposed on the package board in a direction perpendicular to an upper surface of the package board;
a molding member disposed on the package board and at least partially surrounding the at least one semiconductor chip; and
a heat dissipation member disposed on the at least one semiconductor chip and the molding member,
wherein a plurality of uneven structures separating the heat dissipation member from metal objects external to the heat dissipation member is disposed on an upper surface of the heat dissipation member, and
wherein a magnitude of capacitance formed between the heat dissipation member and the metal objects is influenced by the plurality of uneven structures.

19. The semiconductor package of claim 18, wherein a magnitude of capacitance is influenced by a sum of upper surface areas of the plurality of uneven structures, and further determined by heights of the plurality of uneven structures in a direction perpendicular to the upper surface of the package board.

20. The semiconductor package of claim 19, wherein, as the heights of the plurality of uneven structures increase, the capacitance decreases.

21. The semiconductor package of claim 19, wherein, as the sum of the upper surface areas of the plurality of uneven structures decreases, the capacitance decreases.

* * * * *